(12) United States Patent
Ma et al.

(10) Patent No.: US 6,348,373 B1
(45) Date of Patent: Feb. 19, 2002

(54) METHOD FOR IMPROVING ELECTRICAL PROPERTIES OF HIGH DIELECTRIC CONSTANT FILMS

(75) Inventors: Yanjun Ma, Vancouver; Yoshi Ono, Camas, both of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/538,017

(22) Filed: Mar. 29, 2000

(51) Int. Cl.$^7$ .......................................... H01L 21/8242
(52) U.S. Cl. ...................... 438/240; 438/253; 438/396; 438/758; 438/766; 438/768
(58) Field of Search ................. 438/240, 253, 438/396, 758, 766, 768

(56) References Cited

U.S. PATENT DOCUMENTS

| | | | |
|---|---|---|---|
| 5,629,221 A | 5/1997 | Chao et al. | 438/591 |
| 5,672,541 A | 9/1997 | Booske et al. | 437/160 |
| 5,683,918 A | 11/1997 | Smith et al. | 437/21 |
| 5,953,600 A | 9/1999 | Gris | 438/200 |
| 6,156,606 A * | 12/2000 | Michaelis | 438/243 |

OTHER PUBLICATIONS

Abstract from MRS Spring Meeting, Apr. 13–17, 1998 entitled, "Comparison of Rapid Thermal Anneals and Low Temperature Plasma Anneals for Tantalum Oxide in Storage Capacitors and gate Dielectric", by G.B. Alers, D. H. Werder, R.L. Opila, G. Redinbo, R. Urdahl, S. Athreya, pp. 370–371.

* cited by examiner

Primary Examiner—Charles Bowers
Assistant Examiner—Lisa Kilday
(74) Attorney, Agent, or Firm—Matthew D. Radbau; David C. Ripma; Scott C. Krieger

(57) ABSTRACT

A method of improving the electrical properties of high dielectric constant films by depositing an initial film and implanting oxygen ions to modify the film by decreasing the oxygen deficiency of the film while reducing or eliminating formation of an interfacial silicon dioxide layer. An initial high dielectric constant material is deposited over a silicon substrate by means of CVD, reactive sputtering or evaporation. Oxygen ions are preferably implanted using plasma ion immersion (PIII), although other methods are also provided. Following implantation the substrate is annealed to condition the high dielectric constant film.

13 Claims, 3 Drawing Sheets

METHOD FOR IMPROVING ELECTRICAL PROPERTIES OF HIGH DIELECTRIC CONSTANT FILMS

BACKGROUND OF THE INVENTION

This invention relates generally to semiconductor technology and more particularly to the method of improving the electrical properties of high dielectric constant films.

Current Si VLSI technology uses $SiO_2$ as the gate dielectric in MOS devices. As device dimensions continue to scale down, the thickness of the $SiO_2$ layer must also decrease to maintain the same capacitance between the gate and channel regions. Thicknesses of less than 2 nanometers (nm) are expected in the future. However, the occurrence of high tunneling current through such thin layers of $SiO_2$ requires that alternate materials be considered. Materials with high dielectric constants would permit gate dielectric layers to be made thicker, and so alleviate the tunneling current problem. These so-called high-k dielectric films are defined herein as having a high dielectric constant relative to silicon dioxide. Typically, silicon dioxide has a dielectric constant of approximately 4, while it would be desirable to use a gate dielectric material with a dielectric constant of greater than approximately 10.

Because of high direct tunneling currents, $SiO_2$ films thinner than 1.5 nm generally cannot be used as the gate dielectric in CMOS devices. There are currently intense efforts in the search for the replacement of $SiO_2$, with $TiO_2$, $Ta_2O_5$, $(Ba,Sr)TiO_3$ attracting the greatest attention. One common problem with these high-k dielectrics is that they tend to be oxygen deficient. To reduce the leakage current associated with this oxygen deficiency, a post deposition anneal in oxygen at temperature in excess of 700 degrees Celsius is needed. This anneal in oxygen, often grows an interfacial $SiO_2$ layer at the interface between the high-k dielectric and the underlying silicon. The interfacial $SiO_2$ layer reduces the effectiveness of the high-k dielectrics. The presence of the interfacial layer, which can be on the order of 20 angstroms (Å) thick, makes obtaining an equivalent $SiO_2$ layer, also known as equivalent oxide thickness (EOT), of less than 20 Å extremely difficult. Another problem associated with the anneal is that it also causes silicidation.

It would be advantageous if an alternative method of forming high-k dielectrics could be used that would improve the electrical characteristics of the dielectric.

It would be advantageous if an alternative method of overcoming the oxygen deficiency were available.

It would be advantageous if an alternative method of forming high-k dielectrics could be used that would not form an interfacial $SiO_2$ layer.

It would be advantageous if high-k dielectric films could be formed with reduced electrical leakage. It would be advantageous if these high dielectric constant materials could be used in gate dielectrics and storage capacitors of integrated circuits.

SUMMARY OF THE INVENTION

Accordingly, a method of forming an improved dielectric layer for a semiconductor device is provided. The method comprises the steps of:

a) preparing a semiconductor substrate;
b) forming an initial dielectric layer on the substrate;
c) placing the substrate within a chamber;
d) implanting ions into the initial dielectric layer by creating a plasma discharge within the chamber, wherein said plasma discharge includes material to be implanted, whereby the material is implanted into the dielectric layer; and
e) annealing the substrate to properly condition the dielectric layer following implantation.

Preferably, the initial dielectric layer is formed by chemical vapor deposition (CVD), reactive sputtering, or evaporation. The initial dielectric layer, preferably, comprises a high dielectric constant material, such as titanium oxide ($TiO_2$), zirconium oxide ($ZrO_2$), hafnium oxide ($HfO_2$), tantalum oxide ($Ta_2O_5$), or barium and strontium titanium oxide (($Ba,Sr)TiO_3$). The initial dielectric layer is preferably between 25 and 200 angstroms thick.

After the initial dielectric layer is deposited, oxygen ions are implanted to compensate for any oxygen deficiency. Preferably, the oxygen ions will be implanted using plasma immersion ion implantation (PIII). The substrate will be placed within a PIII chamber. Oxygen is introduced into the PIII chamber and energized to form a plasma of ionized oxygen. Preferably, the substrate will be negatively biased with voltage pulses to attract the positive oxygen ions.

Following deposition and implantation, the entire semiconductor substrate is annealed to condition the implant material. Preferably, a rapid thermal anneal (RTA) process is applied to the substrate to anneal out implant damage and condition the dielectric layer to reduce any oxygen deficiency. Alternatively, a conventional heat treatment is applied to the substrate using a furnace.

Subsequent processing can be performed to complete the formation of a desired integrated circuit (IC) device, such as a transistor, a storage capacitor or a ferroelectric memory device.

DETAILED DESCRIPTION OF THE INVENTION

Figure 1:
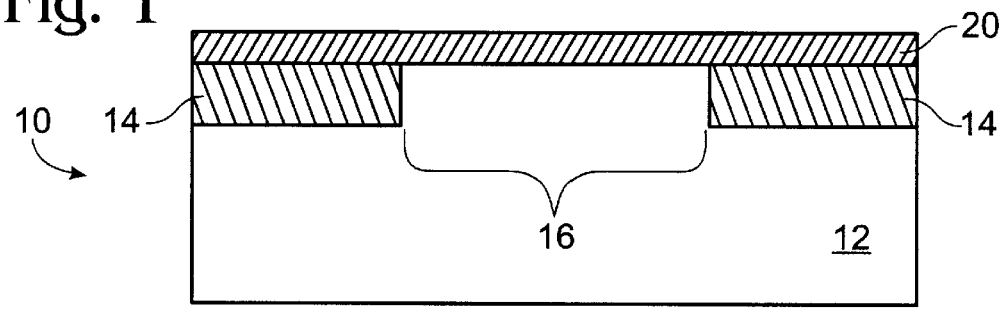
FIG. 1 is a schematic cross-sectional view showing an IC structure during processing with an initial material deposited to form a layer.

Referring now to the drawings, which are for illustration purposes (not to scale), FIG. 1 shows an integrated circuit (IC) structure 10 prior to application of the method of the present invention. Integrated circuit structure 10 comprises, a semiconductor substrate 12 with isolation regions 14 forming an active area 16. Although a trench isolated structure is shown, it is within the scope of the present invention to utilize SOI, or LOCOS isolated structures. A dielectric layer 20 has preferably been deposited over the top of the entire substrate 12, which is also referred to as a "wafer". Dielectric layer 20 is deposited using any appropriate technique for depositing the desired material including, sputtering, evaporation, and chemical vapor deposition. Dielectric layer 20 is preferably composed of a high-k material. The high-k material is preferably selected from titanium oxide ($TiO_2$), zirconium oxide ($ZrO_2$), hafnium oxide ($HfO_2$), tantalum oxide ($Ta_2O_5$), barium and strontium titanium oxide (($Ba,Sr)TiO_3$), zirconium silicate ($ZrSiO_4$), or hafnium silicate ($HfSiO_4$).

Figure 2:
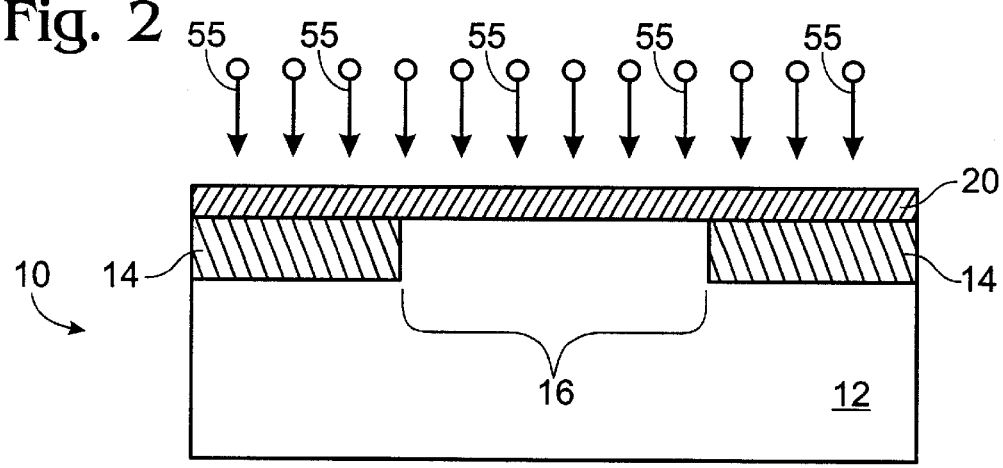
FIG. 2 is a schematic cross-sectional view showing ions being implanted into the layer of initial material.

Following deposition of dielectric layer 20, ions 55 (represented by arrows) are implanted as shown in FIG. 2. Preferably, ions 55 will be oxygen. Implanting oxygen ions provides a preferred means for delivering oxygen to dielectric layer 20. Following implant, oxygen atoms are interspersed throughout dielectric layer 20. This allows the subsequent anneal to be at a lower temperature for a shorter duration. By reducing the temperature and time of the anneal, the formation of an interfacial $SiO_2$ layer is reduced or eliminated.

Following implanting of ions 55, substrate 12 is annealed at a temperature of less than 800 degrees Celsius, preferably between approximately 300 and 800 degrees Celsius. The anneal is preferably accomplished using a rapid thermal anneal (RTA) process in an atmosphere of oxygen, inert gas, or both. Although RTA is preferred, it is also within the scope of the present method to use a furnace to accomplish the anneal. The anneal removes implant damage caused by the implanted ions and conditions dielectric layer 20 along with the interface between the dielectric layer and the underlying silicon. In the case of implanted oxygen, the anneal allows the oxygen to correct the oxygen deficiency within the high-k material forming dielectric layer 20.

After annealing, a layer of metal (not shown) is deposited over the top of dielectric layer 20 and patterned, along with dielectric layer 20, to produce a desired structure. The present invention can be applied to dielectric layers for use in IC structures, such as, transistors, storage capacitors, and ferroelectric memory.

Figure 3:
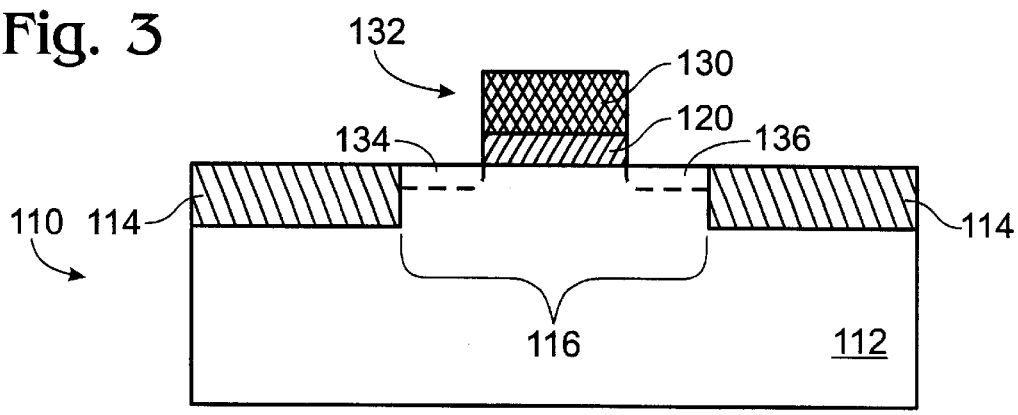
FIG. 3 is a schematic cross-sectional view showing the layer following implantation, anneal and patterning to form a transistor structure.

FIG. 3 shows an example of an IC structure 110, specifically a transistor structure, following processing according to the present invention. An implanted high-k gate dielectric 120 overlies an active region 116 of a silicon substrate 112. Active region 114 is defined by isolation regions 114. A gate electrode 130 overlies gate dielectric 120 to form a gate structure 132. A source region 134 and a drain region 136 are formed on either side of gate structure 132 by conventional processes. Although, in a preferred embodiment, the present invention is applied to the formation of bulk CMOS devices, as stated above, it is also suitable for capacitors, ferroelectric memory and other devices utilizing a dielectric layer.

Figure 4:
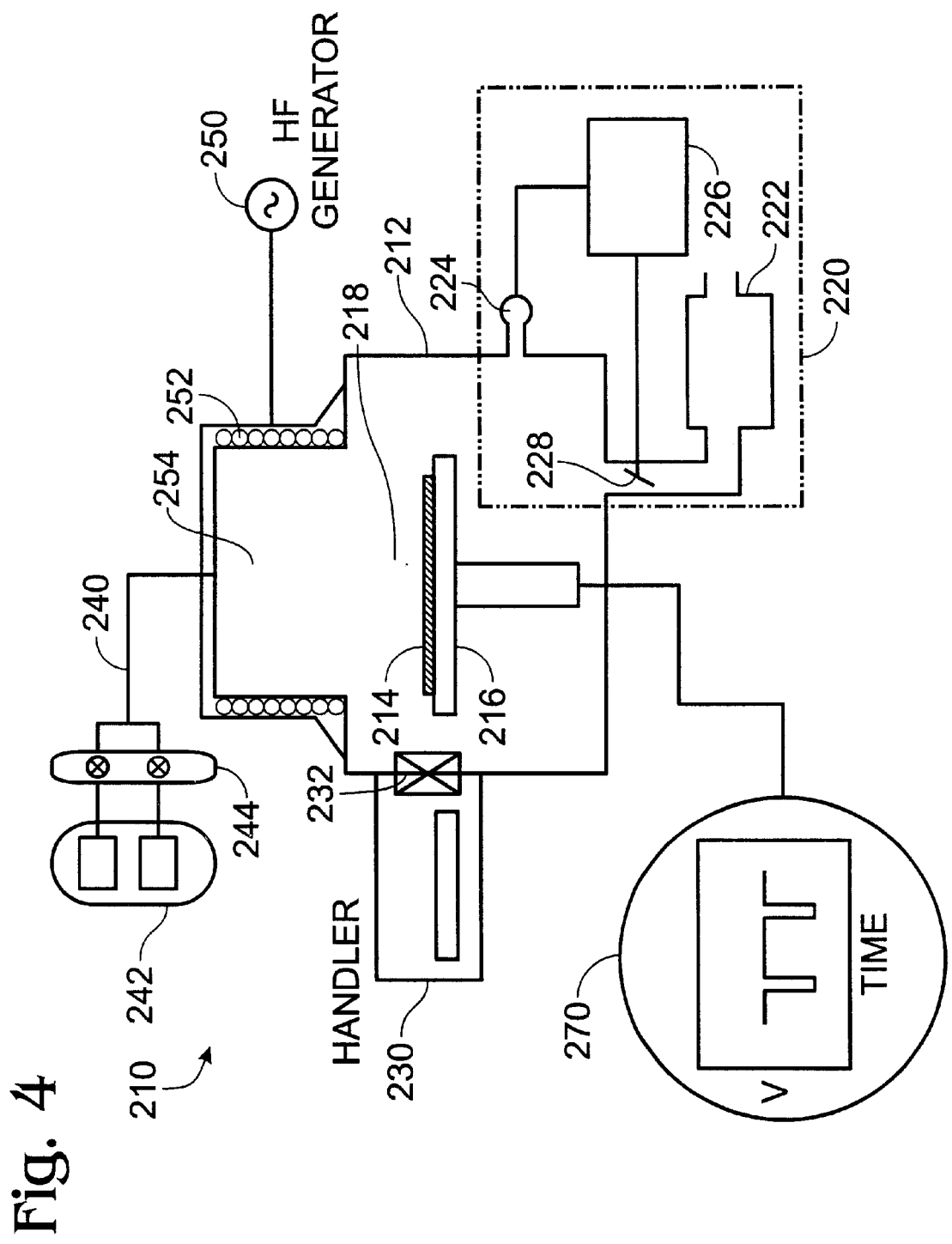
FIG. 4 is a schematic view showing a plasma ion immersion implantation system.

FIG. 4 shows a schematic illustration of a suitable plasma immersion ion implantation (PIII) system 210 for carrying out the ion implant step of the present invention.

Plasma immersion ion implantation system 210 includes a plasma chamber 212 of a size suitable for holding one or more substrates 214, which are supported in the chamber on a chuck 216. Substrate 214 is also commonly referred to as a "wafer". The interior 218 of the chamber 212 can be evacuated, and its pressure regulated, by a pressure control system 220.

Pressure control system 220 includes a pump 222 for exhausting spent gases and contaminants, if any. To control pressure within interior 218 of plasma chamber 212, a pressure sensor 224 is connected to a pressure controller 226, which controls a throttle valve 228. When pressure controller 226 determines that sensor 224 has detected a pressure within interior 218 of the chamber 212 that is outside a predetermined range, pressure controller 226 adjusts valve 228 as necessary to compensate and return the pressure to within the predetermined range.

In a preferred embodiment of the present invention, individual substrates 214 can be moved in and out of chamber 212 by a suitable handler 230 through a gate valve 232 in a chamber wall, allowing substrates to be moved onto a chuck 216 for processing, and then removed from chamber 212. The mechanism by which substrates 214 are moved into the chamber is not critical to the method of the present invention.

Selected gases used in plasma doping during the ion implantation step are introduced into the chamber 212 through a suitable manifold system 240 from various gas supply reservoirs indicated collectively at 242, controlled by valves indicated at 244. For simplicity only two gas supply reservoirs are shown. It is entirely possible, and not inconsistent with the present invention, to have additional gas supply reservoirs, or only a single gas supply reservoir. The manifold system 240, which is shown schematically, may include a gas inlet for blending the gases or a showerhead for distributing the gases within chamber 212 (neither of which is shown).

Plasma energy is supplied to the chamber 212 by an RF generator 250 that typically supplies high frequency (HF) RF power through coils 252 to energize gases within the chamber forming a plasma within plasma formation region 254. The process of energizing gases to form a plasma is also referred to as "igniting a plasma". An inductively coupled plasma of between 300 and 3000 watts is used within chamber 212 at a pressure of between approximately 10 and 100 mT.

The plasma contains implant ions 55 used to modify layer 150 (see FIG. 2). The plasma may contain additional ions, including dilutant gas ions. For example, to implant oxygen (O) the plasma comprises oxygen, or oxygen mixed with an inert dilutant gas, such as argon (Ar), neon (Ne) or helium (He). In addition to using oxygen, gases comprising oxygen and another element, such as nitrous oxide (NO) or $H_2O$, may also be used. Although it is preferable to use an inert dilutant gas or hydrogen, it is not necessary to the present invention.

To increase implant energies, and improve control of the implant process, substrate 214 is preferably biased with a negative voltage to attract the positive ions formed within the plasma. Preferably, the negative voltage bias will be pulsed. Pulsing allows the implanted ions to return to an electrically neutral state, which helps to avoid an accumulation of positive charge along the surface of the substrate 214. The pulsed negative voltage bias is applied to the substrate 214 by a pulse generator 270, shown schematically connected to the chuck 216. The pulses are between approximately 50 volts (V) and 10 kV, but preferably 1 kV. The pulse width is between approximately 10 microseconds and 1000 microseconds, but preferably approximately 100 microseconds, at a frequency between approximately 100 Hz and 5 kHz, but preferably 500 Hz.

Figure 5:
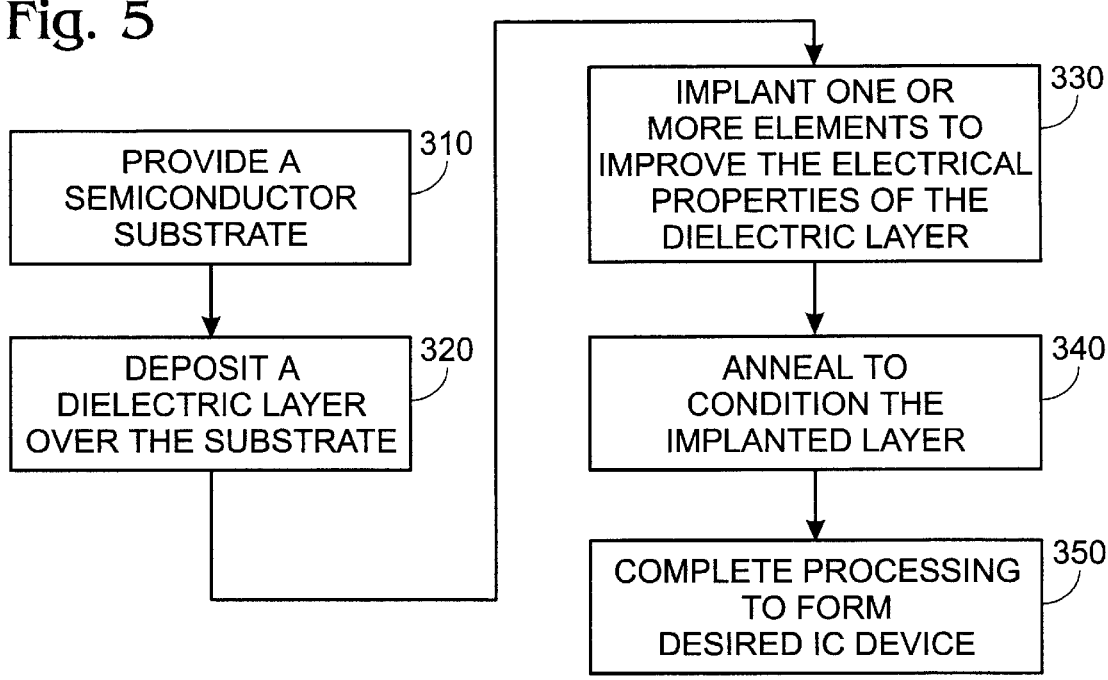
FIG. 5 is a flow chart summarizing the steps in the method of the present invention.

FIG. 5 shows a flow chart of the steps of the method of the present invention. A first step 310 is to provide a semiconductor substrate.

Step 320 is the depositing of a thin layer of an initial material, such as titanium oxide ($TiO_2$), zirconium oxide ($ZrO_2$), hafnium oxide ($HfO_2$), tantalum oxide ($Ta_2O_5$), barium and strontium titanium oxide (($Ba,Sr)TiO_3$), zirconium silicate ($ZrSiO_4$), or hafnium silicate ($HfSiO_4$). In a preferred embodiment, the initial material will be between approximately 25 Å and 200 Å.

In a preferred embodiment of the present invention, reactive sputtering is used to deposit the initial material.

Alternatively, chemical vapor deposition (CVD) or evaporation is used to deposit the initial material.

Step 330 is the implanting of oxygen to reduce, or eliminate, oxygen deficiency of the initial material, or generally increase the amount of oxygen present. The step of implanting is accomplished by plasma immersion ion implantation (PIII). The substrates are introduced into a plasma chamber, and exposed to a plasma containing ions, as described above with reference to FIG. 4. For example to implant oxygen into a previously deposited layer of $TiO_2$ to compensate for oxygen deficiency, as discussed above, oxygen is implanted at energies between approximately 0.1 keV and 2 keV, at a dose between $1 \cdot 10^{13}/cm^2$ and $1 \cdot 10^{18}/cm^2$, but preferably approximately $4 \cdot 10^{17}/cm^2$. Implantation time varies from 10 seconds to 3 minutes. Although PIII is preferred because of its lower energy, and higher dosage characteristics, the step of implanting is also possible using conventional ion beam implantation methods.

Step 340 is the annealing of the implanted material. The wafer, including the implanted material, is heat treated using a furnace or a rapid thermal anneal process to anneal out implant damage and to achieve the appropriate composition and crystallinity. The films are annealed at temperatures between approximately 300 and 800° C. in oxygen, an inert gas, or both.

Step 350 is the deposition of an electrode film of a suitable material. For example, in the case of a $TiO_2$ dielectric layer, a TaN electrode film is deposited and processed according to any state of the art methods. The dielectric layer and electrode film can be patterned to produce a transistor gate, a storage capacitor, or a ferroelectric memory device.

Figure 6:
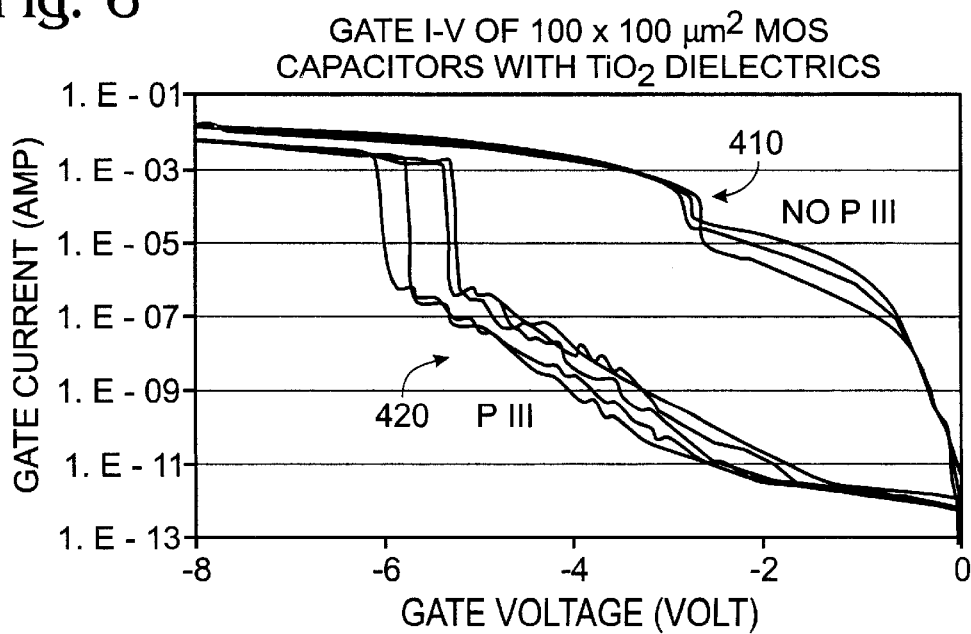
FIG. 6 depicts a comparison of I–V traces for capacitors processed according to the present invention and according to a prior art process.

FIG. 6 shows a graph of the improved electrical characteristics achieved by utilizing the method of the present invention to implant oxygen into a $TiO_2$ dielectric layer. For purposes of comparing electrical properties a 100 micrometer by 100 micrometer capacitor was used. A first set of wafers were processed by depositing a 50 Å film of $TiO_x$, where x was in the range from zero to two. The film was deposited using reactive sputtering on isolated regions of silicon. The first set of wafers were then loaded into a chamber and an oxygen plasma was ignited. The first set of wafers was exposed to oxygen plasma for two minutes to achieve plasma oxidation. Exposure to oxygen plasma does not provide the implanting step of the present invention.

A second set of wafers was processed to produce a 50 Å film, initially identical to the first set of wafers. The second set of wafers was further processed by PIII for two minutes with 200 volt, 100 microsecond pulses applied to the second set of wafers at a frequency of 500 Hz. Both sets of wafers were held at substantially room temperature (approximately 23 degrees Celsius (C)) during these processes. Both sets of wafers were subsequently annealed in oxygen ambient for 10 seconds at 750° C. Tantalum nitride (TaN) electrode material was then deposited on top of the $TiO_2$ film and patterned to form 100 micrometer by 100 micrometer metal-dielectric-silicon capacitors.

A first set of I–V traces 410 (labeled "No PIII") shows the results of current versus voltage measurements for a first set of wafers. A second set of I–V traces 420 (labeled "PIII") shows the results of current versus voltage measurements for the second set of wafers. The second set of wafers, which were processed according to an embodiment of the method of the present invention, exhibited greatly reduced gate leakage current. The reduction in gate leakage current was as high as six orders of magnitude. The breakdown voltage also increased for $TiO_2$ films treated with the PIII oxygen implantation method of the present invention.

The present invention is also well suited to the formation of devices having dielectric layers, including transistors, capacitors and ferroelectric memory devices. The method can be performed in connection with a variety of device structures including replacement gate structures similar to those disclosed by David Evans et al. in "Fabrication Of A Planar MOSFET With Raised Source/Drain By Chemical Mechanical Polishing & Nitride Replacement," filed Feb. 23, 1998 (application Ser. No. 09/028,157) and by Yanjun Ma et al. in "Use Of Silicon Germanium Alloys And Other Alloys As The Replacement Gate For The Fabrication Of MOSFET," filed Sep. 30, 1999 (application Ser. No. 09/410,346).

Alternative embodiments are possible within the scope of the present invention. As is clear from the illustrative examples, the invention can be practiced using a variety of materials, deposition techniques, and implant methods. Other variations of the method within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of forming a dielectric layer for a semiconductor device comprising the steps of:
    a) preparing a semiconductor substrate;
    b) depositing an initial dielectric layer on the substrate;
    c) placing the substrate within a chamber;
    d) implanting ions into the initial dielectric layer by creating a plasma discharge within the chamber, wherein said plasma discharge includes material to be implanted, whereby the material is implanted into the dielectric layer; and
    e) annealing the substrate to properly condition the dielectric layer following implantation.

2. The method of claim 1, wherein the initial dielectric layer has a high dielectric constant.

3. The method of claim 1, wherein the initial dielectric layer is oxygen deficient.

4. The method of claim 1, wherein the initial dielectric layer comprises a material selected from a group consisting of titanium oxide ($TiO_2$), tantalum oxide ($Ta_2O_5$), barium and strontium titanium oxide (($Ba,Sr)TiO_3$), zirconium oxide ($ZrO_2$), hafnium oxide ($HfO_2$), zirconium silicate ($ZrSiO_4$), and hafnium silicate ($HfSiO_4$).

5. The method of claim 1, wherein the step of depositing the initial dielectric layer comprises depositing the initial dielectric layer using reactive sputtering, chemical vapor deposition, or evaporation.

6. The method of claim 1, wherein the step of implanting ions implants oxygen.

7. The method of claim 1, wherein the step of implanting ions further comprises applying a voltage bias to the substrate.

8. The method of claim 1, wherein the step of implanting ions further comprises applying a pulsed voltage bias to the substrate.

9. A method of forming an improved dielectric layer for a semiconductor device comprising the steps of:
    a) preparing a semiconductor substrate;
    b) depositing an initial dielectric layer on the substrate;
    c) implanting oxygen ions into the initial dielectric layer; and
    d) annealing the substrate to properly condition the initial dielectric layer following implantation.

10. A method of forming improved dielectric layer for a semiconductor device comprising the steps of:
   a) preparing a silicon substrate;
   b) depositing an initial dielectric layer between 25 and 200 angstroms thick by chemical vapor deposition, wherein the initial dielectric layer is selected from a group consisting of titanium oxide ($TiO_2$), tantalum oxide ($Ta_2O_5$), barium and strontium titanium oxide (($Ba,Sr)TiO_3$), zirconium oxide ($ZrO_2$), and hafnium oxide ($HfO_2$);
   c) implanting oxygen ions into the initial dielectric layer, by placing the silicon substrate into a chamber, applying negative voltage pulses in the range between 50 volts and 10 kV with a pulse width between 10 and 1000 microseconds at a frequency between 100 Hz and 5 kHz to the silicon substrate, introducing oxygen into the chamber and igniting a plasma whereby the positively charged oxygen ions produced within the plasma are attracted to the silicon substrate and implanted to form an implanted dielectric layer; and
   d) annealing the substrate in oxygen by a rapid thermal anneal process at a temperature between 300 and 800 degrees Celsius to condition the implanted dielectric layer and the interface with the silicon substrate.

11. A method of forming a dielectric layer for a semiconductor device comprising the steps of:
   a) preparing a semiconductor substrate;
   b) depositing an oxide having a high dielectric constant on the substrate;
   c) placing the substrate within a chamber;
   d) implanting oxygen ions into the oxide by creating a plasma discharge within the chamber, whereby the oxygen is implanted into the oxide; and
   e) annealing the substrate to properly condition the oxide following implantation.

12. The method of claim 11, wherein the oxide comprises a material selected from a group consisting of tantalum oxide ($Ta_2O_5$), barium and strontium titanium oxide (($Ba, Sr)TiO_3$), zirconium oxide ($ZrO_2$), hafnium oxide ($HfO_2$), zirconium silicate ($ZrSiO_4$), and hafnium silicate ($HfSiO_4$).

13. A method of forming a dielectric layer for a semiconductor device comprising the steps of:
   a) preparing a semiconductor substrate;
   b) depositing an oxide having a high dielectric constant on the substrate;
   c) implanting oxygen ions into the oxide by ion beam implantation, whereby the oxygen is implanted into the oxide; and
   d) annealing the substrate to properly condition the oxide following implantation.

* * * * *